United States Patent [19]

Weiss

[11] 3,798,572

[45] Mar. 19, 1974

[54] TUNABLE CRYSTAL OSCILLATOR

[75] Inventor: Reinhold Weiss, Berlin, Germany

[73] Assignee: Krone GmbH, Berlin, Germany

[22] Filed: Dec. 29, 1972

[21] Appl. No.: 319,601

[30] Foreign Application Priority Data

Dec. 30, 1971 Germany.......................... 2165745

[52] U.S. Cl.......... 331/108 D, 331/116 R, 331/135, 331/159

[51] Int. Cl............................................. H03b 5/32

[58] Field of Search........... 331/108 D, 116 R, 158, 331/159, 135

[56] References Cited

UNITED STATES PATENTS 3,324,415 6/1967 Sheffet....................... 331/116 R X

OTHER PUBLICATIONS

Carlow, "IC Op Amp Simplifies Design of Crystal-Controlled Oscillator," Electronic Design, January 4, 1969, pp. 124, 126.

DiMilia et al., IBM Technical Disclosure Bulletin, "Evaporation Thickness Monitor Oscillator," Vol. 13, No. 1, June 1970, pp. 252, 253.

*Primary Examiner*—Herman Karl Saalbach
*Assistant Examiner*—Siegfried H. Grimm
*Attorney, Agent, or Firm*—Edwin E. Greigg

[57] ABSTRACT

A tunable crystal oscillator having a crystal operated in series resonance and having an oscillating frequency which is detunable in a given frequency range close to the natural frequency of the crystal by means of at least one variable impedance component. The crystal is connected in series with a first operational amplifier having a feedback branch, the output of the first amplifier being coupled to the input of a second operational amplifier. The output of the second amplifier is connected to that terminal of the crystal which is in opposed connection to the first operational amplifier. The crystal oscillator is arranged to satisfy a Laplace transformed differential equation derived from the network of the crystal oscillator, the two amplifiers and associated circuit components.

18 Claims, 5 Drawing Figures

TUNABLE CRYSTAL OSCILLATOR

The invention relates to a tunable crystal oscillator with a crystal operated in series resonance and having an oscillating frequency which may be continuously detuned within a specific frequency range near the natural frequency of the crystal by means of at least one component with variable impedance.

Turnable crystal oscillators are required in the most diverse technological fields, for example, in phase-controlled oscillators for TV receivers but also for regenerators in pulse code modulation (PCM) transmission links.

The prior art already discloses (see also for example A.Huzii, Y. Okamoto, Group Bit Synchronization for PCM-16M Multiplexing System, Review of the Electrical Communication Laboratory, Vol. 17, No. 5/6, May/June 1969) crystal oscillators with a crystal operated in series resonance and having an oscillating frequency which may be continuously detuned over a specific frequency range by means of a variable capacitance in the form of a so-called capacitance diode, the oscillating frequency ($\omega$) being always greater than the natural frequency ($\omega_0$) of the crystal provided the crystal oscillators do not contain any additional inductances in the form of separate coils.

It is a disadvantage of such crystal oscillators that the capacitance diodes on the one hand require a relatively large control voltage of approximately 5 V and on the other hand the capacitance variation achieved thereby is relatively slight, since it amounts to only approximately 10 – 40 pF so that the frequency tuning range is relatively narrow, more particularly since the oscillating frequency cannot reach and drop below the natural frequency of the crystal.

It is therefore the object of the invention to provide a crystal oscillator of the kind mentioned hereinbefore having an oscillating frequency which may be continuously varied over a specific frequency range about the natural frequency of the crystal and may be relatively simply detuned without the use of high control voltages but also without the use of coils which would otherwise prevent such a crystal oscillator being constructed in integrated circuit form.

According to the invention this problem is solved in that the crystal is serially connected via a first component unit with a first impedance to a first operational amplifier the feedback branch of which contains a second component unit with a second impedance, the output of the first operational amplifier being coupled via a third component unit with a third impedance to the input of a second operational amplifier the feedback branch of which is provided with a fourth component unit having a fourth impedance, the output of the second operational amplifier being connected to that terminal of the crystal which is in opposed connection to the first operational amplifier, that the crystal oscillator satisfies the Laplace-transformed differential equation $$A \cdot p^3 + B \cdot p^2 + C \cdot p + D = 0$$

where $p = j\omega$ ($j$ = imaginary unit, $\omega$ = angular oscillating frequency) and that the frequency of the crystal oscillator is substantially tuned by adjustment of the C coefficient of the Laplace-transformed differential equation which depends on all impedances.

The Laplace-transformed differential equation stated above may be precisely derived for the network of the crystal oscillator with the two operational amplifiers and the connected circuit components on the basis of the general expert knowledge relating to this field (see for example Taschenbuch der Elektrotechnik, Vol. 3, Nachrichtentechnik, 1970, Berlin), that is to say the coefficients may be represented precisely as functions of the impedances including the crystal impedance. However, this will be explained hereinbelow for only one embodiment because the general expressions become complex. This example will also indicate that the coefficient C is the sole coefficient which depends on all impedances so that the value of C may be changed by varying any other of the impedances.

It will be clear that the principle according to the invention may also be obtained by more than two operational amplifiers while maintaining the general circuit configuration, namely by four, six and so on operational amplifiers, however, this would be less advantageous because of the increased expenditure.

A preferred embodiment of the crystal oscillator according to the invention is characterized in that the first component unit has a negligibly small impedance, that the second component unit has a substantially purely non-reactive impedance, that the third component unit also has a substantially purely non-reactive impedance, that the fourth component unit is a first capacitor and that the impedance of the second and/or of the third component unit is or are variable.

The use of component units having a substantially nonreactive impedance offers the particular advantage that an impedance change extending practically from zero to infinity may be obtained thus achieving a wide tuning range.

The variation of impedance ($R_1$ or $R_2$) of the second and third component unit is in principle identical. However, it will be subsequently shown that the differential coefficients $\delta\omega/\delta R_1$ and $\delta\omega/\delta R_2$ are of different magnitude.

It is advisable if the first component unit is a further capacitor.

This enables the crystal to be capacitatively tuned, that is to say, the oscillating frequency of the crystal oscillator may be higher than the natural frequency of the crystal.

In one embodiment of the invention the fourth component unit which is disposed parallel to the first capacitor has a first non-reactive resistance. The first non-reactive resistor ensures reliable starting of the crystal oscillator if it is necessary to take into account the non-reactive resistance loss of the crystal (see also equation 4*b*).

In a further advantageous embodiment of the invention the second and/or third component unit is or are a field effect transistor or field effect transistors (FET) the drain-source connection of which is connected parallel to a second non-reactive resistor and that the impedance of the field effect transistor may be varied by means of a control voltage applied to its gate terminal.

The second non-inductive resistor connected in parallel to the source-drain connection limits the upper value of the total resistance of such parallel circuit and at the same time linearizes the impedance-control voltage characteristics of the source-drain connection.

Tunable second and third component unit may finally be simply obtained if the second and/or third component unit comprise a symmetric T-network or networks, comprising two non-reactive series resistors and one variable non-reactive shunt resistor and more particularly if the variable non-reactive shunt resistor is formed by the serial connection of a further non-reactive resistor and the dynamic resistance of a diode whose connecting point may be supplied with a control voltage fed in via an additional non-reactive resistor.

The construction of the second and third component unit as a symmetrical T-network offers the advantage that one side of the shunt resistor is at a defined ground potential.

This is of particular importance if the shunt resistor is formed substantially by the dynamic resistance of a diode, which by contrast to the previously mentioned embodiment with the field effect transistor, may be driven by a control voltage which is balanced with respect to earth.

The invention will be explained by reference to the drawing in which.

Figure 1:
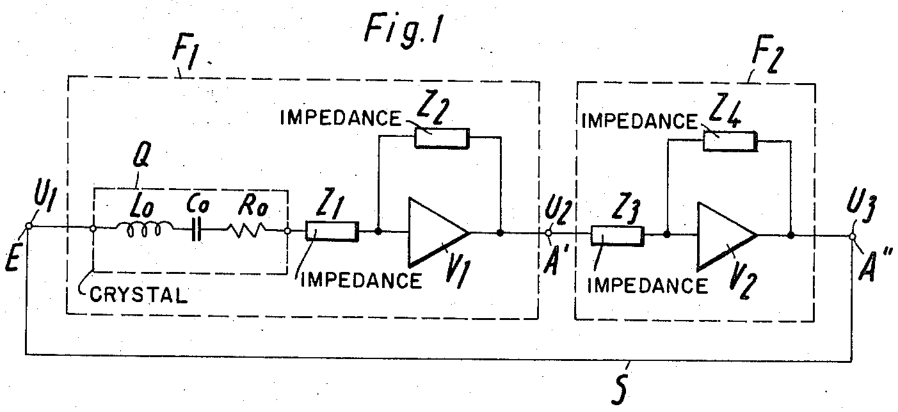
FIG. 1 is the basic circuit diagram of the crystal oscillator according to the invention.

According to FIG. 1 the input E of the crystal oscillator is directly connected to one terminal (without reference symbol) of a crystal Q which is arranged in known manner as a series resonance circuit so that in a substitution circuit diagram its self-inductance $L_0$, its self-capacitance $C_0$ and its non-reactive equivalent resistance $R_0$ are connected in series. The terminal (without reference symbol) associated with the crystal Q and facing away from the input E is connected via a first component unit $Z_1$ to the input of a first operational amplifier $V_1$ whose negative feedback branch contains a second component unit $Z_2$.

The crystal Q together with the first operational amplifier $V_1$ and its circuit components represent a first active filter $F_1$, that is to say, a sub-assembly having a specific frequency or phase response.

The output A' of the first active filter $F_1$ is followed by a second active filter $F_2$ the output A'' of which also forms the output of the crystal oscillator and is fed back via a loop S to the input E.

The input of the second filter $F_2$ is provided with a third component unit $Z_3$ which extends to a second operational amplifier $V_2$ whose negative feedback branch contains a fourth component unit $Z_4$.

The method of operation of the crystal oscillator according to the invention may be explained as follows:

The two operational amplifiers $V_1$ and $V_2$ together with their circuit components in the form of the four component units $Z_1 - Z_4$ have opposing effects the result of which is as though a further series oscillating circuit were connected on the input side of the crystal Q.

In rough approximation, the connected operational amplifier $V_1$ represents a differentiating element which causes phase rotation of $(-180° + \phi_D)$ between the voltages $U_2$ and $U_1$. The connected operational amplifier $V_2$ approximates an integrating element which produces phase rotation of $(-180° - \phi_I)$ between the voltages $U_3$ and $U\ 2$.

The differentiating and integrating action is cancelled when $\phi_D = \phi_I$ and the crystal Q is operated at its natural frequency $\omega_0$. However, if $\phi_D \gtrless \phi_I$ the resultant frequency $\omega$ is detuned to values which are higher and lower respectively than $\omega_0$.

In mathematical terms, the following relationships are obtained for the crystal oscillator of FIG. 1 between the voltages $U_1$, $U_2$ and $U_3$ at the input E and the output A' and A'' if based on the known expression for operational amplifiers and if the impedances of the first to fourth component units are designated with $Z_1\ (p)$, $Z_2(p)$, $Z_3(p)$ or $Z_4(p)$ respectively and if $Z_Q$ refers to the impedance of the crystal Q, wherein $p = j\ \omega$ refers to the Laplace operator and $\omega$ is the angular frequency of the crystal oscillator:

$$U_2(p)/U_1(p) = Z_2(p)/(Z_Q(p) + C_1(p)) \tag{1}$$

when $Z_Q(p) = R_0 + pL_0 + (1/pC_0)$ $$U_3(p)/U_2(p) = Z_4(p)/Z_3(p) \tag{2}$$

and accordingly $$U_1(p) = U_3(p) \text{ for the closed circuit}$$

$$Z_4(p)/Z_3(p) \cdot Z_2(p)/(Z_Q(p) + Z_1(p)) = 1 \tag{3}$$

The general Laplace-transformed differential equation is obtained by transformation of equation (3) as $$A{\cdot}p^3 + B{\cdot}p^2 + C{\cdot}p + D = 0 \tag{3a}$$

Figure 2:
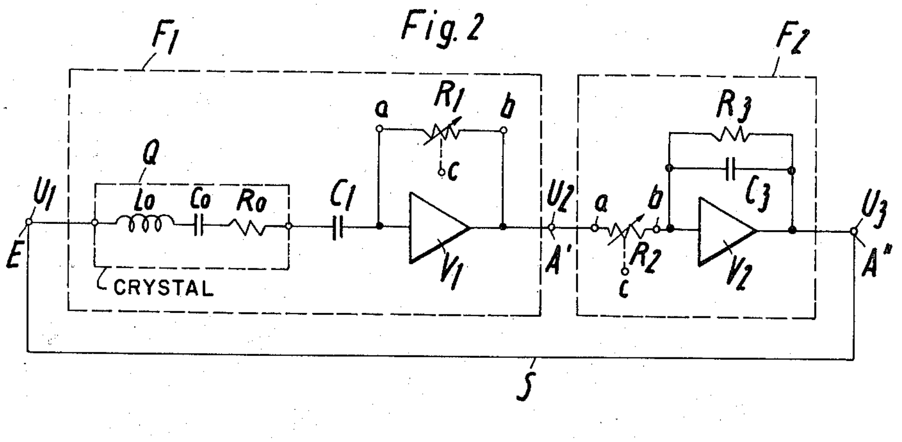
FIG. 2 is the circuit diagram of a preferred embodiment of the crystal oscillator according to the invention.

A preferred embodiment of the crystal oscillator of FIG. 1 is illustrated in FIG. 2.

In this embodiment the first component unit is a capacitor $C_1$. The second component unit $R_1$ has a variable and substantially purely non-reactive impedance and is provided with two terminals *a* and *b* which are directly connected to the terminals of the first operational amplifier $V_1$ and where appropriate with a third or control terminal *c* which is supplied with a control voltage or a control current for impedance changing if impedance changing is not performed in purely mechanical manner, for example, if the second component unit $R_1$ is a simple potentiometer the tapping of which is displaced for the purpose of changing the impedance.

The third component unit $R_3$ also has an adjustable and substantially purely non-reactive impedance and in the same way as the second component unit $R_1$ is provided with two terminals *a* and *b*. The third component unit $R_3$ is also provided with an optional third terminal *c* for supplying a control voltage or a control current unless the impedance change is performed mechanically, for example by sliding the wiper of a conventional potentiometer.

The oscillating conditions of the crystal oscillator illustrated in FIG. 2 follow from the equation (3) stated above if the reference symbols of FIG. 2 are taken for the inductances, capacitances and non-reactive resistance values, that is to say:

$$Z_1(p) = 1/pC_1$$
$$Z_2(p) = R_1$$
$$Z_3(p) = R_2$$
$$Z_4(p) = R_3/(1 + pR_3C_3)$$

also $\omega_0^2 = 1/L_0C_0$ ($\omega_0$ = natural frequency of the undamped crystal Q):

$$p^3\frac{R_3C_3}{\omega_0^2}+p^2\left(\frac{1}{\omega_0^2}+R_0C_0\odot R_3C_3\right)+p\left[R_3C_3\left(1+\frac{C_0}{C_1}\right)+R_0C_0-R_1C_0\frac{R_3}{R_2}\right]+1+\frac{C_0}{C_1}=0 \quad (4)$$

A comparison between equation (4) and equation (3*a*) provides the following values for the coefficients stated below:

$$A = R_3C_3/\omega_0^2$$
$$B = 1/\omega_0^2 + R_0C_0 \cdot R_3C_3$$
$$C = R_3C_3\ [1 + (C_0/C_1] + R_0C_0 - R_1C_0\ (R_3/R_2)$$
$$D = 1 + (C_0/C_1).$$

Equation (4) represents the Laplace-transform of a differential equation of the third order.

Special cases include:

1st $$R_3 \rightarrow \infty$$
$$R_0 \rightarrow 0$$
$$p^2/\omega_0^2 + [1 + (C_0/C_1) - (R_1C_0/C_3R_2] = 0 \quad (4a)$$

Equation (4*a*) is the Laplace-transform of a differential equation of the second order. Its solution provides an undamped oscillator oscillation.

2nd $$R_3 \rightarrow \infty$$
$$R_0 \neq 0$$
$$(p^2/\omega_0^2) + p \cdot R_0C_0 + [1 + (C_0/C_1) - (R_1C_0/R_2C_3)] = 0 \quad (4b)$$

Equation (4*b*) is the Laplace-transform of a differential equation of the second order. Its solution provides a damped oscillation, that is to say, the starting condition is not satisfied.

3rd $$R_3 \neq \infty$$
$$R_0 \neq 0$$

A known frequency estimate of the complete equation (4) when $R_3 \neq \infty$ and $R_0 \neq 0$ (see also A. Blum, P. Kalisch: Anordnungarelationen fur die Schwingfrequenz und die Koeffizienten der charakteristischen Gleichung bei SinusOszillatoren, AEU, Vol. 25 (1971), No. 8, provides the non-equality $$\omega_0^2\left\{1+\frac{C_0}{C_1}\left(1+\frac{R_0C_1}{R_3C_3}-\frac{R_1C_1}{R_2C_3}\right)\right\} < \omega^2 < \omega_0^2\,\frac{1+\dfrac{C_0}{C_1}}{1+R_0C_0R_3C_3\omega_0^2} \quad (5)$$

According to equation (5) $\omega$ may be detuned via $R_1$ and/or $R_2$ in case 3 so as to provide $$\omega(R_1 \text{ or } R_2) \gtrless \omega_0 \quad (6)$$

Equation (5) indicates that if the capacitor $C_1$ were bypassed, and the capacitance $C_1$ would act therefore as if it were infinitely large the right-hand term is reduced to $$\omega_0^2 \cdot 1/(1 + R_0C_0R_3C_3\omega_0^2)$$

This would mean: $\omega<\omega_0$.

However, in order to make $\omega<\omega_0$ in order to achieve a wide tuning range, the right-hand term in equation (5) must be made substantially larger than $\omega_0^2$ which requires an infinitely large value of $C_1$. The requirement in accordance with equation (6) can therefore be satisfied only by the introduction of $C_1$.

According to equation (4*a*) the non-reactive resistance $R_3$ may also be omitted if the non-reactive equivalent resistance $R_0$ of the crystal Q is sufficiently small in accordance with equation (4*a*) but the inequality (6) continues to be satisfied.

Equation (5) also indicates that frequency tuning may in principle be achieved by simultaneous or optional operation of the component units $R_1$ and $R_2$.

The following differential coefficients may be derived from the left-hand term of equation (5):

$$\delta\ (\omega^2)/\delta\ R_1 = -\ \omega_0^2\ (C_0/C_3) \cdot (1/R_2) \quad (6a)$$

$$\delta\ (\omega^2)/\delta\ R_2 = +\omega_0^2\ (C_0/C_3) \cdot (R_1/R_2^2) \quad (6b)$$

It may therefore be seen that the change of $\omega^2$ (or of $\omega$) with respect to $R_1$ is constantly negative and independent of the value of $R_1$ itself while the change of $\omega^2$ with $R_2$ is positive and in addition inversely proportional to $R_2^2$.

In general, variation of only one of these component units would be sufficient for frequency tuning. However, the tuning sensitivity is improved if both component elements are varied with respect to their impedance.

As already mentioned, the impedance of component units $R_1$ and/or $R_2$ may be performed electrically or mechanically. In general preference will be given to electrical impedance changing for obvious reasons.

Figure 3B:
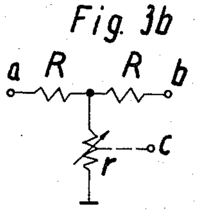
FIGS. 3*a* to 3*c* are embodiments of the second and third component unit according to the invention with variable and substantially purely non-reactive impedance.
Figure 3C:
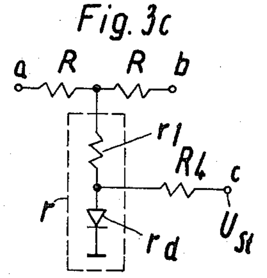
Figure 3A:
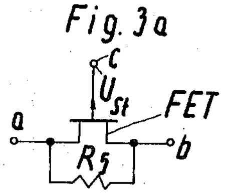

A preferred embodiment of electrically controlled component unit $R_1$ and/or $R_2$ is illustrated in FIG. 3*a*. According to this illustration the second and third component unit is formed by the parallel connection of a field effect transistor FET and its drain-source resistance $R_{DS}$ and a further non-reactive resistance $R_5$. The drain-source resistance $R_{DS}$ may be varied by means of a control voltage $U_{St}$.

The resistance value $R_1$ may then be calculated as:

$$R_1 = (R_{DS} \cdot R_5)/(R_{DS} + R_5) \quad (7)$$

Another embodiment of the two component units $R_1$ and $R_2$ is illustrated in FIG. 3*b* which relates to a balanced T-network comprising non-reactive series resistors $R$ and a variable non-reactive shunt resistor $r$.

The resistance value $R_1$ is calculated as (see also Taschenbuch der Elektrotechnik, Vol, 3, Nachrichtentechnik, Page 633, FIG. 3. 121) as:

$$R_1 = 2\ R\ [1 + (R/2r)] \quad (8)$$

FIG. 3*c* finally shows a more concrete embodiment of FIG. 3*b* in which the variable shunt resistor $r$ is provided by the serial connection of a non-reactive resistor $r_1$ and the dynamic resistance $r_d$ of a diode. The control voltage $U_{St}$ is supplied via a further non-reactive resistor $R_4$ which is connected to the junction between the resistances $r_1$ and $r_d$ (see also FIG. 3*c*).

In this case, the resistance value $R_1$ is expressed by:

$$R_1 = 2\ R\ [1 + (R/2r)] \text{ with} \quad (9)$$

$$r \approx r_1 + r_d \quad (10)$$

What is claimed is:

1. A tunable crystal oscillator of the type having a crystal operated in series resonance and having an oscillating frequency which may be continuously detuned within a specific frequency range near the natural frequency of its crystal by means of at least one component with variable impedance, said oscillator comprising a crystal serially connected, via a first component unit with a first negligible small impedance, to a first operational amplifier having a feedback branch; a second component unit with a second impedance which is substantially a purely non-reactive impedance contained in said feedback branch; an output of said first operational amplifier coupled, via a third component unit with a third impedance which is substantially a purely non-reactive impedance, to an input of a second operational amplifier having a further feedback branch; a fourth component unit having a fourth impedance in form of a first capacitor provided in said further feedback branch; an output of said second operational amplifier connected to that terminal of said crystal which is in opposed connection to said first operational amplifier; and wherein impedance of at least one of said second component unit and said third component unit is variable; whereby the crystal oscillator satisfies the Laplace-transformed differential equation $$A \cdot p^3 + B \cdot p^2 + C \cdot p + D = 0$$

where $p = j\ \omega$ ($j$ = imaginary unit, $\omega$ = angular oscillating frequency) and that the frequency of the crystal oscillator is substantially tuned by adjustment of the C coefficient of the Laplace-transformed differential equation which depends on all impedances.

2. A crystal oscillator according to claim 1, wherein impedances of said second component unit and said third component unit are both variable.

3. A crystal oscillator according to claim 2, wherein said first component unit is a further capacitor.

4. A crystal oscillator according to claim 1, wherein impedance of said second component unit is variable.

5. A crystal oscillator according to claim 4, wherein said first component unit is a further capacitor.

6. A crystal oscillator according to claim 1, wherein impedance of said third component unit is variable.

7. A crystal oscillator according to claim 6, wherein said first component unit is a further capacitor.

8. A crystal oscillator according to claim 1, wherein said first component unit is a further capacitor.

9. A crystal oscillator according to claim 1, wherein said fourth component unit includes a non-reactive resistance connected in parallel with said first capacitor.

10. A crystal oscillator according to claim 1, wherein said second component unit is a field effect transistor, the drain source connection of which is connected in parallel to a non-reactive resistance, and the impedance of the field effect transistor may be varied by means of a control voltage applied to its gate terminal.

11. A crystal oscillator according to claim 1, wherein said third component unit is a field effect transistor, the drain source connection of which is connected in parallel to a non-reactive resistance, and the impedance of the field effect transistor may be varied by means of a control voltage applied to its gate terminal.

12. A crystal oscillator according to claim 1, wherein said second and said third component units are respective field effect transistors, the drain source connection of each respective transistor being connected in parallel to a respective non-reactive resistance, the impedance of each respective field effect transistor may be varied by means of a respective control voltage applied to its respective gate terminal.

13. A crystal oscillator according to claim 1, wherein said second component unit is a balanced T-network comprising two non-reactive series resistors and a variable non-reactive shunt resistance.

14. A crystal oscillator according to claim 13, wherein said variable non-reactive shunt resistance is formed by a serial connection of a non-reactive resistor and dynamic resistance of a diode whose connecting point may be supplied with a control voltage which may be fed in via an additional non-reactive resistor.

15. A crystal oscillator according to claim 1, wherein said third component unit is a balanced T-network comprising two non-reactive series resistors and a variable non-reactive shunt resistance.

16. A crystal oscillator according to claim 15, wherein said variable non-reactive shunt resistance is formed by a serial connection of a non-reactive resistor and dynamic resistance of a diode whose connecting point may be supplied with a control voltage which may be fed in via an additional non-reactive resistor.

17. A crystal oscillator according to claim 1, wherein said second and said third component units are formed by respective balanced T-networks, each T-network comprising respectively two non-reactive series resistors and a variable non-reactive shunt resistance.

18. A crystal oscillator according to claim 17, wherein each of said variable non-reactive shunt resistances is formed by a respective serial connection of a respective further non-reactive resistor and dynamic resistance of a diode whose connecting point may be supplied with a control voltage which may be fed in via an additional non-reactive resistor.

* * * * *